United States Patent [19]
Da Costa

[11] Patent Number: 5,166,960
[45] Date of Patent: Nov. 24, 1992

[54] PARALLEL MULTI-PHASED A-SI SHIFT REGISTER FOR FAST ADDRESSING OF AN A-SI ARRAY

[75] Inventor: Victor M. Da Costa, San Carlos, Calif.

[73] Assignee: Xerox Corporation, Stamford, Conn.

[21] Appl. No.: 871,243

[22] Filed: Apr. 20, 1992

[51] Int. Cl.[5] .................................... H03K 19/03
[52] U.S. Cl. .................................... 377/70; 377/77; 377/78
[58] Field of Search ............... 377/70, 77, 78, 80; 307/298

[56] References Cited

U.S. PATENT DOCUMENTS

| | | | |
|---|---|---|---|
| 4,466,020 | 8/1984 | O'Connell | 358/293 |
| 4,588,997 | 5/1986 | Tuan et al. | 346/76 PH |
| 4,766,450 | 8/1988 | O'Connell | 346/155 |
| 4,866,742 | 9/1989 | Fujiyama et al. | 377/70 |
| 4,998,146 | 3/1991 | Hack | 357/4 |
| 5,073,723 | 12/1991 | Da Costa | 307/298 |
| 5,090,036 | 2/1992 | Hoehn | 377/78 |
| 5,128,974 | 7/1992 | Maekawa | 377/78 |
| 5,136,622 | 8/1992 | Plus | 377/78 |

Primary Examiner—John S. Heyman
Assistant Examiner—Scott A. Onellette
Attorney, Agent, or Firm—Lisa M. Yamonaco

[57] ABSTRACT

An improved shift register assembly having an integrated multi-phased dynamic shift register with a corresponding multi-phased driving buffer for addressing elements of an array. The shift register and buffer combination is used to select segments on the array having a common select line thus reducing the number of input lines needed to address such an array. Furthermore, the multi-phased operation of the shift register allows for faster operation than tyhat of a traditional shift register setup.

9 Claims, 5 Drawing Sheets

PARALLEL MULTI-PHASED A-SI SHIFT REGISTER FOR FAST ADDRESSING OF AN A-SI ARRAY

This application is cross-referenced to related application Ser. No. 07/871,250, to Da Costa et al., filed concurrently with this application titled "Electrographic Writing Head" which is hereby incorporated by reference.

BACKGROUND OF THE INVENTION

This invention relates to a thin film transistor device for driving a thin film transistor array. In particular, the driving device comprises a parallel multi-phased shift register and a multi-phased buffer combination for fast addressing select lines of a thin film transistor array, where the driving device is integrated with the array.

Amorphous silicon, (a-Si), thin film transistor technology has found numerous applications because of its low cost and processing compatibility with low temperature glass substrates which allows fabrication of large area systems. Circuits are regularly fabricated with linear dimensions in excess of 30 cm. Thin film transistors, TFTs, are widely used as pixel addressing elements in large area active matrix liquid crystal displays, and in printing and scanning bars. Printing systems based upon Ionography and Electrography have also been demonstrated with a-Si. An example of a typical electrographic writing head, manufacturable by thin film fabrication techniques, is fully disclosed in U.S. Pat. No. 4,588,997 to Tuan et al. which is hereby incorporated by reference. An example of a fabrication technique is also discussed in U.S. Pat. No. 4,998,146 to Hack.

There are a variety of advantages to large area technology when it is applied to input or output devices. For many competing technologies some form of magnification is needed to scale up the system; for example laser printing or CCD scanning require optical magnification. Printing and scanning systems built in large area technology contain fewer mechanical and optical parts so the reliability can be higher. Moreover, with integrated electronic content on the input or output device, the number of interconnections may be reduced. Therefore, it would be advantageous to integrate more functionality onto a device whereby reducing the number of interconnects.

The technology for large area electronics is based in large part on an extension of crystal silicon integrated circuit technology; process modules of metal sputtering, photolithography, and chemical vapor deposition are still used. The substrate, however, can be a 32 cm×34 cm rectangle of Corning 7059 ® glass as opposed to a 15 cm² slice from a crystalline silicon ingot. In the version of a-Si technology used for the devices in the print array there are three metal layers, a Chrome gate metal, a self aligned Chrome on N+source and drain, and an Aluminum interconnect. The TFTs are in the inverted staggered structure and a passivation layer of silicon nitride is used over the TFT channel. Polyimide is used for inter-metal isolation and for final passivation.

The most striking feature of the drive characteristics of a-Si TFTs is the low output current. These transistors have both a low mobility and a large threshold voltage (1 V to 2 V). The mobility is nearly three orders of magnitude below crystal silicon. To partly compensate for the low drive current, higher operating voltages are used. The transistors can withstand $V_{GS}$ (gate to source voltage) potentials up to 40 V without failure. However even with the higher drive voltage, the switching time is on the order tens of microseconds.

The slow speed of a-Si TFTs can be offset by the fact that a-Si applications lend themselves to a high degree of parallelism. For instance in an electrographic writing head, each individual writing electrode has its own separate driving circuit and in theory all of the circuits can operate in parallel for the head to function. In reality however, the number of inputs needed to drive all the circuits in parallel makes this approach impossible. To reduce the inputs to a manageable number, a simple multiplexing scheme is used. In this scheme, the a-Si circuits are grouped into segments of driver circuits which share a common data bus for data input, and each circuit in a segment has a common select line. To load the entire device with data, each select line is enabled in turn loading the data present on the bus into the segment, one segment at a time.

Besides the speed, another complication is the threshold voltage shift. This is much faster in a-Si than in crystal silicon. Rises of up to 5 V in an operational lifetime are seen and must be compensated for in the circuit design. Because of the higher threshold voltages and the slow speed of the TFTs, operating voltages are typically 15 V to 25 V. This complicates the input to large area circuits because level shifting buffers must be used. A large number of level shifters can add a significant cost to a system. It is therefore desirable to have as few inputs as possible thus reducing the number of level shifting buffers required. Such a reduction in input pads to an integrated circuit, such as disclosed herein, will decrease cost and typically increase reliability.

The example device discussed herein utilizing the present invention is a 11.84 inch, 400 driver per inch print array. The array has 32 parallel data drivers per segment, resulting in 148 segments; each being controlled by a single select line. Such a large number of inputs can drive up the cost of the array interface significantly, for reasons already discussed. There is opportunity to reduce the number of inputs even further by moving the select line drive circuitry directly into the a-Si array.

One method is to integrate into the array an a-Si serial-in/parallel-out shift register, whereby shifting a single active bit down the register enables each of the segments in turn. However, such an implementation may yield a device which is too slow for the needs of many arrays such as the electrographic writing head (e.g. 25 kHz). What is needed is an a-Si shift register for driving a one dimensional print array integrated on the same substrate as a-Si pixel drivers used for writing, which can operate at an increased speed. It would be advantageous to have a shift register design which could operate easily at an increased speed (e.g. 100 kHz) and which reduces the number of select line inputs on a device (e.g. from 148 to 9), thereby representing a significant system cost reduction. U.S. Pat. No. 4,466,020 to O'Connell shows the use of a shift register integrated on a combination read/write array. However, the shift register on that array is for loading image data, not for enabling segments of selected devices.

Another example of a device which can utilize the approach described herein is an amorphous Silicon active matrix display. For instance, for a display with 1024 columns by 1024 rows, this multi-phased shift register device can be used for the row selection. If this display is to have a frame rate of 60 Hz, this would require a line time of 16 microseconds, well within the speed of this shift register's operation. And the number of inputs for the row drivers would be reduced from 1024 to 9. As can be appreciated, the present invention could be utilized by many types of TFT arrays. Although an a-Si device is described herein, it can be appreciated that the following invention could be made from non-crystalline silicon (e.g. poly-crystalline, micro-crystalline).

SUMMARY OF THE INVENTION

In accordance with the present invention, provided is a thin film transistor device for driving a select line on a thin film transistor array, the select line being used to select a plurality of elements on the array and the device is integrated with the array. The device comprises; a multi-phased dynamic shift register element having an output signal; and a multi-phased buffer connected to the output signal of the multi-phased dynamic shift register element, which provides sufficient drive current for selecting the plurality of elements which are sequentially selected. The multi-phased buffer samples the output of the multi-phased shift register only during one of the phases where the output of the shift register is valid. With this sampling scheme, the speed of the sequential segment selection can be increased by a factor of four by integrating four four-phased shift registers one quarter out of phase with each other.

DETAILED DESCRIPTION OF THE INVENTION

Figure 1:
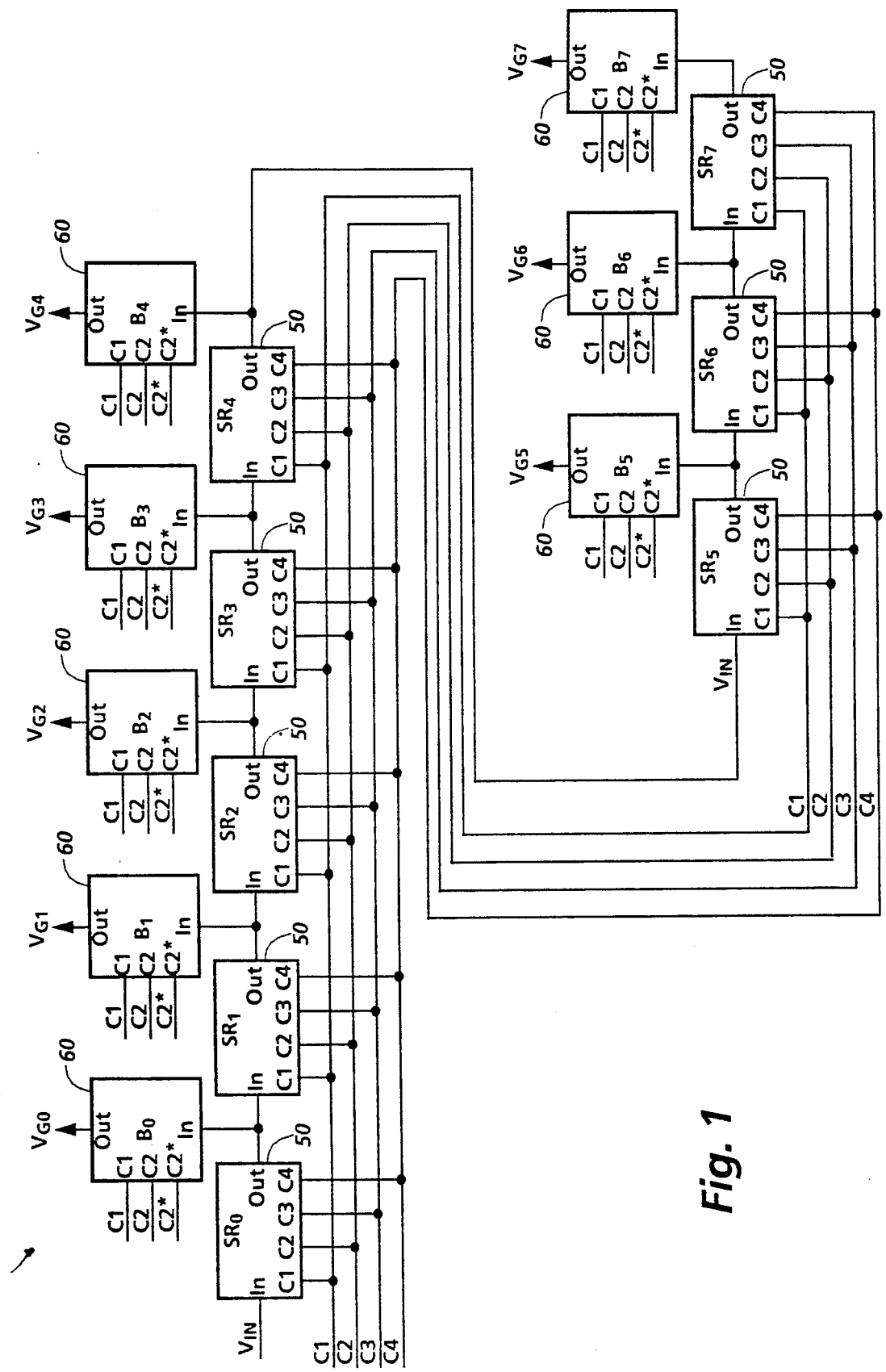
FIG. 1 is a block diagram of a typical shift register/buffer configuration.

As discussed in the background, integrating a shift register onto an a-Si array for the purpose of creating sequential select pulses can be advantageous. Referring to FIG. 1, shown are eight four-phased dynamic shift register elements 50, (SR$_0$–SR$_7$), connected in a traditional configuration, which can be used on an array to produce sequential select pulses. As seen in this traditional configuration, signal V$_{IN}$ is shifted down the line of shift registers such that the output of SR$_0$ feeds the input of SR$_1$, whose output feeds the input of SR$_2$, etc. In general, the output of one shift register element becomes the input of the next shift register element directly in line with it hence shifting the V$_{IN}$ signal down the line. A four-phased shift register is depicted here having four clock inputs, C1, C2, C3, C4 needed for operation. The waveforms of these clock inputs can be seen in FIG. 4. Note that clocks C1, C2, C3, and C4 are connect to the clock inputs C1, C2, C3, C4 of shift register 50 respectively. This clock connection is the same for each shift register element 50 shown in FIG. 1.

As is known with four-phased dynamic shift registers, the output of shift register 50 is valid only during two phases of the required four phases of the input clocks. When using the output of shift register 50 as a select pulse, that output must be buffered to guarantee that the select signal V$_{Gn}$ is always in a valid state and to provide enough driving current to drive several select lines. In this case, buffer 60 is used to drive the resulting select signal. Detailed descriptions of four-phased dynamic shift register 50 and buffer 60 are described below.

Figure 2:
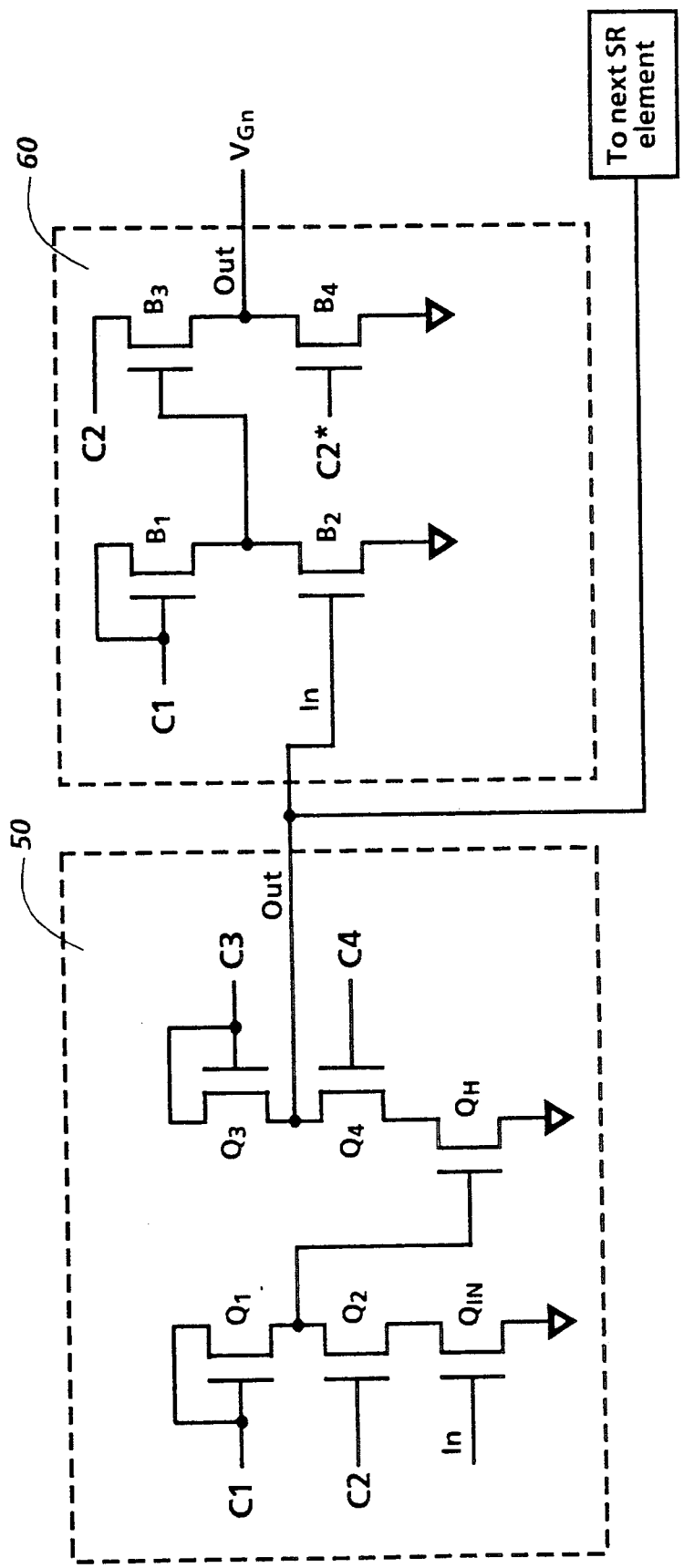
FIG. 2 is a schematic of the dynamic shift register element and the buffer element used in FIG. 1.
Figure 4:
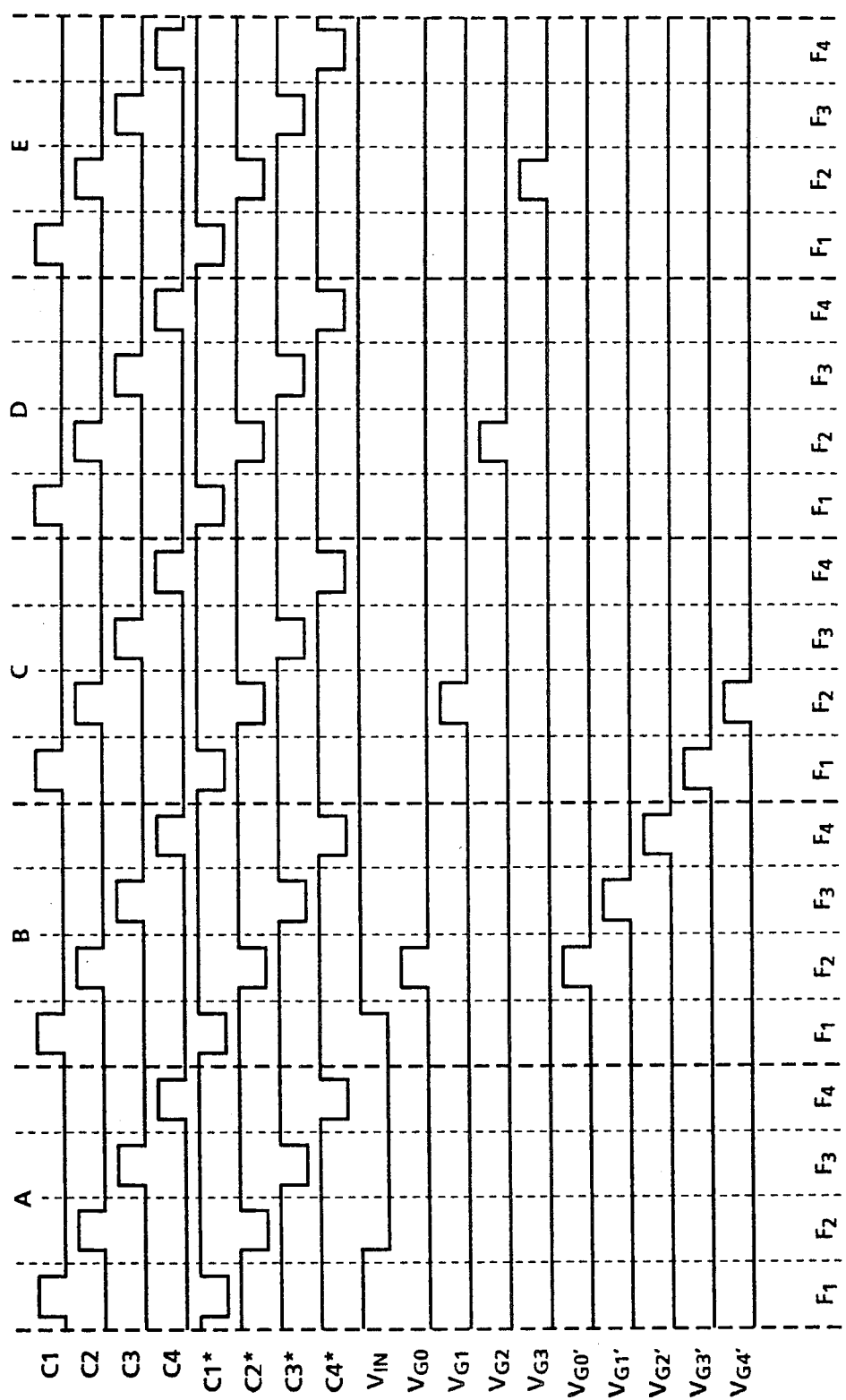
FIG. 4 is a timing diagram representing the clocks needed to drive the dynamic shift register/buffer configurations and the outputs of the buffer elements of FIGS. 1 and 2.

Referring now to FIGS. 2 and 4, a typical four-phased ratioless shift register 50 design is shown which provides a large switching range and allows for fast operating speed since no pull-up devices are used. Four non-overlapping clock pulses, C$_1$, C$_2$, C$_3$, C$_4$ as seen in FIG. 4, and represented during clock phases F$_1$ to F$_4$, are used to drive shift register 50. As is known in the art, shift register 50 works as follows: during clock phase F$_1$ the gate capacitance of TFT Q$_H$ (between the gate of TFT Q$_H$ and ground) is charged through TFT Q$_1$, this is the pre-charge phase; during clock phase F$_2$, TFT Q$_2$ is switched on, thus the gate capacitance of TFT Q$_H$ will then be discharged or remain the same depending on the input to the gate of TFT Q$_{IN}$, this is the input sample phase; clock phases F$_3$ and F$_4$, are similar except that the output capacitance on the OUT line is pre-charged during F$_3$ and the state of TFT Q$_H$ is sampled during F$_4$; and, after one cycle of the four-phased clocks, the input on the gate of TFT Q$_{IN}$, the IN signal, has been shifted to the output becoming the OUT signal. This OUT signal becomes the signal to be used as a sequential select line. It is important to note that the output bit state of the OUT signal is only valid during the F$_1$ and F$_2$ clock phases of the following cycle.

Buffer 60 uses a two phase operation and is designed to sample the OUT signal of shift register 50 only during a single phase. As discussed above, the OUT signal is valid only during two phases so buffer 60 needs to sample this output signal only during the time the output of the shift register is valid. When the output of the shift register is not valid, the output of buffer 60 must be valid but inactive. The select line OUT or V$_{Gn}$ is brought high by charging through TFT B$_3$ during phase F$_2$, and is held to ground by TFT B$_4$ during every phase except F$_2$, this is accomplished by connecting the gate of TFT B$_4$ to the complement of clock C2 (C2*). The reason for this grounding is to create a valid logic low output on the V$_{Gn}$ line when the output of the shift register is not valid.

During the F$_1$ phase, the output of shift register 50 is sampled. If the valid output of shift register 50 is low, the gate capacitance of B$_3$ is charged, causing the select line to be pulsed high during the F$_2$ phase. Buffer 60 is an inverting buffer changing the input low to an output high. The charging through TFT B$_3$ is aided by the fact that when TFT B$_3$ is turned on, its gate is essentially floating (both TFT B$_1$ and TFT B$_2$ are off). Therefore the gate to drain capacitance of TFT B$_3$ causes the gate potential to bootstrap off of the rising F$_2$ pulse, maintaining a high gate to source potential during the charging. For the other case, where the valid output of shift register 50 is high, TFT B$_3$ is partially charged to the divided voltage between TFT B$_1$ and TFT B$_2$ during phase F$_1$. During the F$_2$ phase this node will continue discharging leaving TFT B$_3$ in a marginally on state, thus when clock C2 goes high there will be some unwanted charging of the select line $V_{Gn}$. This problem can be overcome by making TFT B4 sufficiently large so that when it switches off its gate to drain capacitance pulls the select line sufficiently negative to make this charging insignificant resulting in an output low signal.

If each shift register and buffer combination has a four-phased shift register, then the output of buffer 60 becomes a pulse sequentially selecting the devices connected to the outputs of the shift register elements. As seen in FIG. 4, this pulse or selection signal $V_{Gn}$ occurs once per every four clock phases. Therefore, when using a four-phased shift register element in the traditional setup of FIG. 1, the output of the shift register and buffer combination is valid only during one of the four phases. In other words, during three of the four phases there are no elements being selected.

Figure 3:
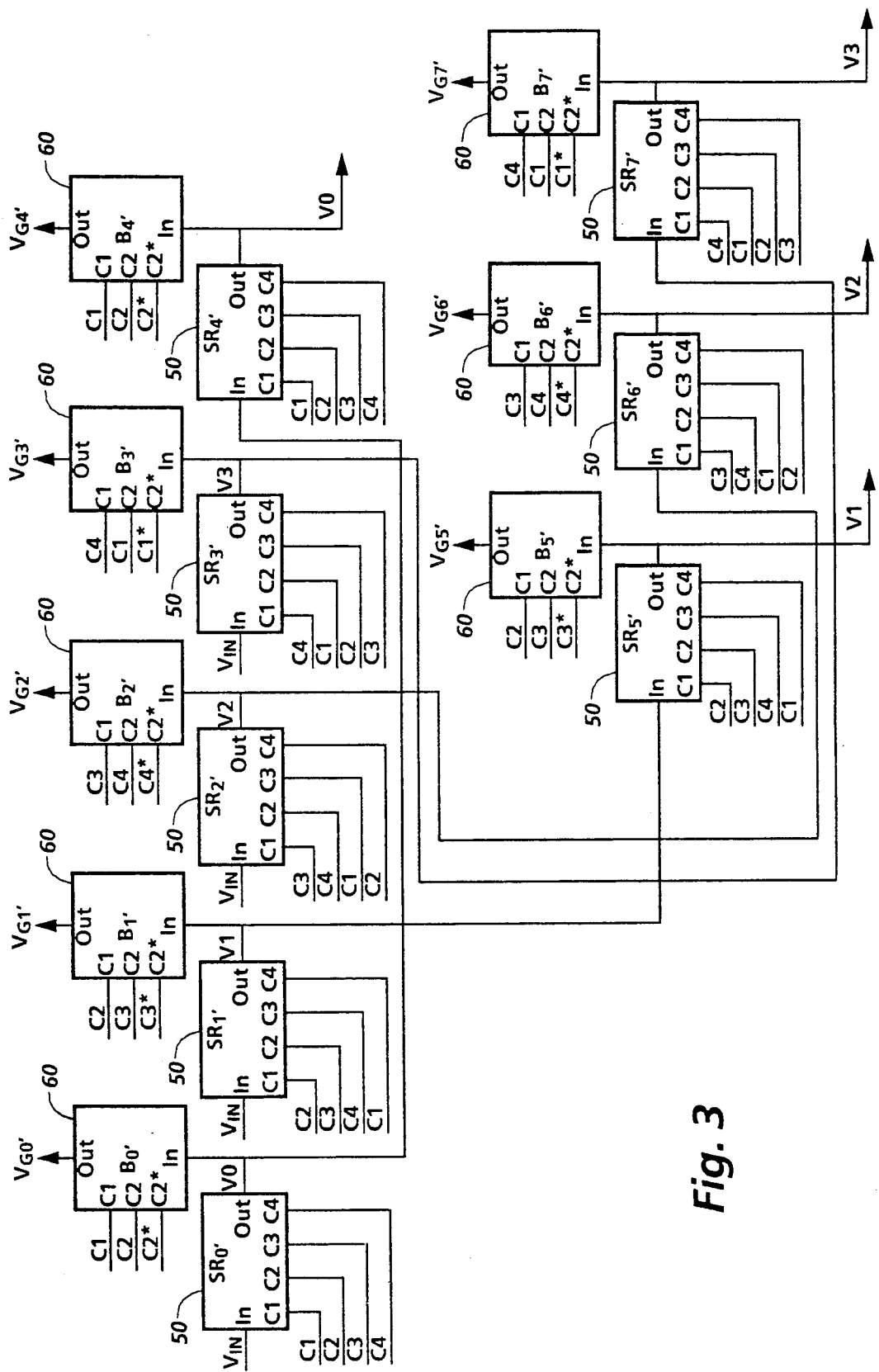
FIG. 3 is a block diagram of a shift register/buffer configuration of the present invention utilizing the shift register element and buffer element of FIG. 2.

FIG. 3 shows eight four-phased dynamic shift register elements 50 ($SR_0'$-$SR_7'$) with their respective buffers 60 ($B_0'$-$B_7'$) having their inputs and outputs connected according to the present invention. As shown, the output of the first shift register element $SR_0$ provides the input to shift register element $SR_4'$. In the same manner, shift register $SR_1'$ provides the input to shift register element $SR_5'$, and so on. In this configuration, when using four-phased dynamic shift registers, the output of one shift register element provides the input to the fourth shift register element down the line. Another notable difference between the configuration of FIG. 3 from that of FIG. 1 is in the way the clocks are connected to the clock inputs of shift registers 50 and buffers 60. In the configuration of FIG. 3, each shift register 50 is connected one quarter out of phase with the next consecutive or adjacent shift register 50 in line.

For example, the clock inputs C1, C2, C3, and C4 to shift register $SR_0'$ are connected to clocks C1, C2, C3, and C4 respectively. However, the clock inputs C1, C2, C3, and C4 to the next shift register $SR_1'$ are connected to clocks C2, C3, C4, and C1 respectively and are one quarter out of phase with the clock inputs to $SR_0'$. Note also that the clock inputs to the buffers associated with each shift register are also one quarter out of phase with respect to the next buffer in line. It is this "out of phase" clocking which provides for the increase in performance as will be discussed below.

The resulting outputs of the shift register system of FIG. 3 are similar to that of a traditional long shift register of FIG. 1, i.e. by producing sequential select pulses. However, as will become apparent, using the multi-phased approach as described herein results in the ability to run a four-phased dynamic shift register system at four times the speed of the traditional setup. To the devices being selected, sequential select pulses are produced as with the traditional setup, but by running the shift register/buffer combination out of phase, the select pulses can be produced four times as fast because each of the four phases creates a select pulse which can be seen on FIG. 4 with respect to signals $V_{Gn}'$.

For further illustration of this four-phased operation, refer to the description below and FIGS. 2, 3 and 4. In the timing diagram of FIG. 4, when the input to the first four shift registers, $S_{R0}'$-$S_{R3}'$, ($V_{IN}$) goes low, each shift register 50 will sample during different phases. It is the clock on input C2 which determines which phase the device will sample on. From the clock connections of FIG. 3, it is shown that: $SR_0'$ samples during $F_2$, $SR_1'$ samples during $F_3$, $SR_2'$ samples during $F_4$, and $SR_3'$ samples during $F_1$ of the next group of phases. During the next four phases of the clocks this input data will be shifted to the output of each shift register 50. The output of each shift register will be valid during only two phases. For $SR_0'$ the output will be valid during phases $F_1$ and $F_2$ in cycle B, for $SR_1'$ the output will be valid during phases $F_2$ and $F_3$ in cycle B, for $SR_2'$ the output will be valid during phases $F_3$ and $F_4$ in cycle B, and for $SR_3'$ the output will be valid during phases $F_4$ and $F_1$ in cycles B and C. As already described, buffer 60 will sample during the phases when the shift register output is valid, delivering its boosted signal during the second of the two. Therefore select line $V_{G0}'$ is enabled during $F_2$ of cycle B, since buffer $B_0'$ is sampling a valid output during $F_1$. $V_{G1}'$ is enabled during $F_3$ of cycle B, $V_{G2}'$ is enabled during $F_4$ of cycle B, and $V_{G3}'$ is enabled during $F_1$ of cycle C. This cycle will repeat with the next four select lines enabled from $F_2$ of cycle C to $F_1$ of cycle D and so forth, until all of the required select lines on a device are enabled. It is the clock which is connected to the C2 inputs of the buffers which determines which phase the select lines will be enabled on.

As already stated, charging and discharging through a-Si TFTs typically takes about 10 microseconds, therefore since each phase in the shift register operation involves charging through a TFT, a combination four-phased shift register 50 with a buffer 60 as seen in FIG. 1 has an operating frequency of 25 kHz. However, since the output of the buffer 60, $V_{Gn}$, only occurs during one of the four phases ($F_2$), and since the sole purpose of shift register 50 is to shift a single active bit down the line of shift registers creating sequential select pulses, the speed at which these select pulses are produced can be improved by a factor of four. As can be seen from the timing diagram of FIG. 4, a select pulse $V_{Gn}'$ from the combination shift register 50 and buffer 60 configuration of FIG. 3, the select lines $V_{Gn}'$ are active during each phase of the multi-phased clock giving an effective shift register speed of 100 kHz. In other words, $V_{Gn}$ is active during $F_2$ of B, $F_2$ of C, $F_2$ of D and $F_2$ of E whereas $V_{Gn}'$ is active during $F_2$ of B, $F_3$ of B, $F_4$ of B $F_1$ of C and $F_2$ of C.

The combination parallel shift register and buffer operation needs a complement of each of the four clock inputs, C1*, C2*, C3*, C4*, bringing the number of clock inputs to eight. However, only one shift register input $V_{IN}$ is needed since a single line can be used to start the first four parallel shift registers at the beginning of the line of shift registers. Since each of the parallel shift registers only sample their input during their respective sample phases, to start a line the shift register input $V_{IN}$ just needs to be pulsed low during the first occurrences of phases $F_2$, $F_3$, $F_4$, and $F_1$ as shown in FIG. 4.

Figure 5:
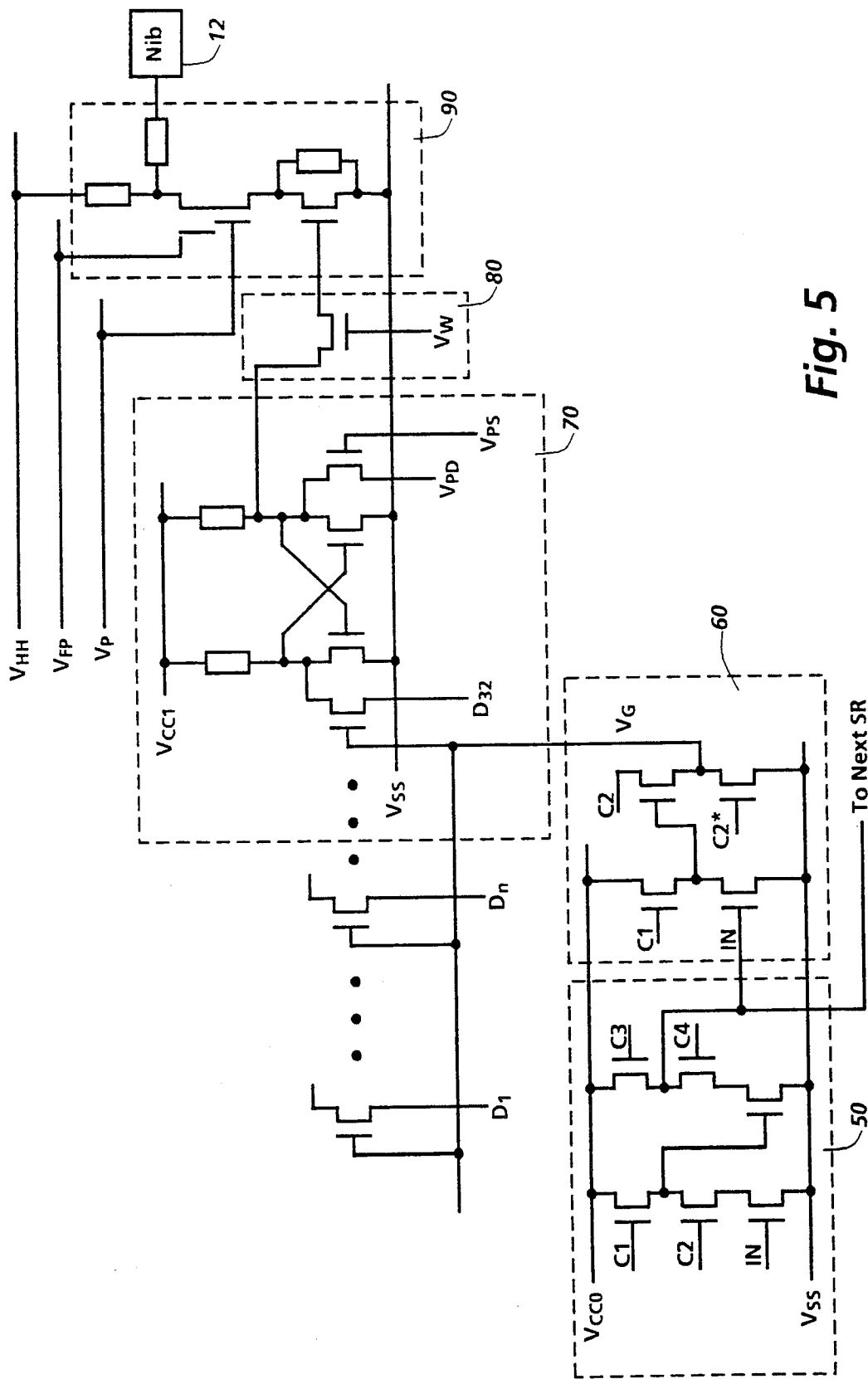
FIG. 5 is a schematic representation of an exemplary thirty-two bit segment of an integral thin film writing head utilizing the present invention.

Referring now to FIG. 5, shown is a thirty-two bit segment of a electrographic writing head utilizing the present invention. Several of these thirty-two bit segments can be aligned in a linear array making a full width writing head. Each of the thirty-two bit segments are sequentially selected by a single $V_{Gn}$ pulse created by the shift register/buffer configuration shown in FIG. 3. Although an electrographic writing head is used as an example of where the present invention can be utilized, it can be appreciated that the devices of the present invention could be used to drive the many types of TFT arrays as discussed above. A detailed description of a TFT electrographic writing head utilizing the present invention can be found in cross-referenced application titled "Electrographic Writing Head."

In general, the output of buffer 60, selection signal $V_G$, drives a group of thirty-two Random Access Memory (RAM) cells 70 concurrently. In order to provide adequate current drive for charging the gate capacitance of the group of static ram cells 70 (typically about 10pF) and to provide all known states for select line $V_G$, buffer 60 is utilized between the output bit of shift register element 50 and the gate select line, $V_G$ of RAM cell 70. The pulse delivered by the buffer 60 is inverted from the output of shift register 50, therefore a line time is accomplished by shifting a single active bit 0 (low) down shift register 50 rather than shifting a bit 1 (high). Once all RAM cells 70 in each thirty-two bit segment of array 10 are loaded, a write pulse, $V_W$ is given to all latch cells 80 latching the data from RAM cells 70 onto latch cells 80. With the latching of the data, the data on latch cells 80 is then simultaneously transferred to nibs 12 through cascode circuit 90 for writing onto a medium. As stated, an electrographic writing head is only one example of where the present invention can be utilized.

A four-phased multi-phased shift register configuration has been described above. However, one can envision a multi-phased shift register configuration having M phases. A plurality of multi-phased dynamic shift registers arranged in a linear array can be divided into blocks of M shift register elements. The output signal from each of the plurality of multi-phased dynamic shift register elements in a block of M is connected to an input of a corresponding multi-phased dynamic shift register element in a next consecutive block of M shift register elements. This configuration implies that the shift register elements within a block of M would be operated 1/M out of phase with each other.

In other words, in the case where M is equal to four, each shift register would be four-phased shift register. A linear array of four-phased shift register elements would then be divided up into blocks of four four-phased shift register elements. The output of the first shift register in a first block of four shift registers would drive the input to the first, or corresponding, shift register in a next block of four shift registers. In a similar manner, the output of the second shift register element in the first block of four shift registers would drive the input to the corresponding second shift register in the next block of four shift registers. In the disclosed case, M is equal to four but the invention is not intended to be limited as such.

While the invention has been described with reference to the structures disclosed, it is not confined to the details set forth, but is intended to cover such modifications or changes as may come within the scope of the following claims.

I claim:

1. An improved shift register assembly for sequentially driving a series of select lines on a thin film transistor array, each select line being used to select a plurality of elements on said array, said assembly being integrated with said array, comprising:
   a multi-phased dynamic shift register element having an output signal;
   a multi-phased buffer receiving an input signal and providing an output signal; and
   said input signal is connected to said output signal of said multi-phased dynamic shift register element, and said output is for providing drive capabilities for said each select line being used to select a plurality of elements on said array, said select lines being consecutively activated during each phase of multi-phased operation.

2. An improved shift register assembly according to claim 1 wherein said output signal of said multi-phased buffer is active only during one phase of multi-phased operation.

3. An improved shift register assembly, comprising:
   an array of thin film transistor elements where a segment of N elements are consecutively addressed by a common select line, said array having a plurality of said segments;
   a plurality of multi-phased dynamic shift register elements, each of said multi-phased dynamic shift register elements having an output signal for addressing said segment of N elements of said array; and
   a multi-phased buffer having an input and an output, said input is connected to each of said output signals of each of said multi-phased dynamic shift register elements, and said output is for providing drive capabilities for each said common select line of said array, said select lines being sequentially activated during each phase of multi-phased operation.

4. An improved shift register assembly according to claim 3 wherein said plurality of multi-phased dynamic shift register elements are divided into blocks where each of said blocks has M number of said shift register elements, where M equals the number of phases, each of said plurality of multi-phased dynamic shift register elements are operated 1/M out of phase with a next multi-phased dynamic shift register element, said blocks of M are aligned consecutively in a linear array, and said output signal from each of said plurality of multi-phased dynamic shift register elements in said block of M is connected to an input of a corresponding multi-phased dynamic shift register in a next consecutive block of M of said shift register elements.

5. An improved shift register assembly according to claim 4 wherein said output of said multi-phased buffer is active only during one phase of multi-phased operation.

6. An improved shift register assembly according to claim 5 wherein M is equal to four.

7. An improved shift register assembly, comprising:
   an array of thin film transistor elements where a segment of N elements are consecutively addressed by a common select line, said array having a plurality of said segments;
   a plurality of four-phased dynamic shift register elements, each of said four-phased dynamic shift register elements having an output signal for addressing said segment of N elements of said array, said plurality of four-phased dynamic shift register elements are divided into blocks of four, each of said blocks of four having four four-phased dynamic shift register elements, said blocks of four are aligned consecutively in a linear array, and said output signal from each of said plurality of four-phased dynamic shift register elements in said block of four is connected to an input of a corresponding multi-phased dynamic shift register in a next consecutive block of four of said shift register elements; and
   a two phased buffer having an input and an output, said input is connected to each of said output signals of each of said four-phased dynamic shift register elements, and said output is for providing drive capabilities for each said common select line of said array, said select lines being sequentially activated during each phase of four-phased operation;

8. An improved shift register assembly according to claim 7 wherein said output of said two phased buffer is active only during one phase of multi-phased operation.

9. An improved shift register assembly, comprising
a plurality of multi-phased dynamic shift register elements;
said plurality of multi-phased dynamic shift register elements are divided into blocks where each of said blocks has M number of said shift register elements, where M equals the number of phases;
each of said plurality of multi-phased dynamic shift register elements are operated 1/M out of phase with a next multi-phased dynamic shift register element;
said blocks of M are aligned consecutively in a linear array; and
said output signal from each of said plurality of multi-phased dynamic shift register elements in said block of M is connected to an input of a corresponding multi-phased dynamic shift register in a next consecutive block of M of said shift register elements.

* * * * *